US005592667A

United States Patent [19]

Bugajski

[11] Patent Number: 5,592,667
[45] Date of Patent: Jan. 7, 1997

[54] METHOD OF STORING COMPRESSED DATA FOR ACCELERATED INTERROGATION

[75] Inventor: Joseph M. Bugajski, Ypsilanti, Mich.

[73] Assignee: Triada, Ltd., Ann Arbor, Mich.

[21] Appl. No.: 336,942

[22] Filed: Nov. 10, 1994

Related U.S. Application Data

[63] Continuation-in-part of Ser. No. 207,382, Mar. 7, 1994, abandoned, which is a continuation of Ser. No. 978,360, Nov. 18, 1992, Pat. No. 5,293,164, which is a continuation of Ser. No. 706,949, May 29, 1991, Pat. No. 5,245,337.

[51] Int. Cl.⁶ .............................. G06F 7/00; G06F 12/00
[52] U.S. Cl. ..................... 395/613; 395/444; 395/447; 341/51; 341/79; 341/87; 364/DIG. 2; 364/951.3; 364/966.2; 364/964.28
[58] Field of Search .................. 395/600, 444, 395/447; 341/51, 79, 87; 364/DIG. 1, DIG. 2

[56] References Cited

U.S. PATENT DOCUMENTS

| | | | |
|---|---|---|---|
| 4,064,489 | 12/1977 | Babb | 364/200 |
| 4,464,650 | 8/1984 | Eastman et al. | 340/347 |
| 5,023,610 | 6/1991 | Rubow et al. | 341/51 |
| 5,049,881 | 9/1991 | Gibson et al. | 341/95 |
| 5,058,144 | 10/1991 | Fiala et al. | 375/122 |
| 5,150,119 | 9/1992 | Yoshida et al. | 341/51 |
| 5,151,697 | 9/1992 | Bunton | 341/92 |
| 5,153,591 | 10/1992 | Clark | 341/51 |
| 5,274,805 | 12/1993 | Ferguson | 395/600 |
| 5,386,211 | 1/1995 | Goveas | 341/51 |
| 5,396,625 | 3/1995 | Parkes | 395/600 |
| 5,412,384 | 5/1995 | Chang et al. | 341/79 |
| 5,424,732 | 6/1995 | Iyer et al. | 341/51 |
| 5,463,389 | 10/1995 | Klayman | 341/51 |
| 5,485,609 | 1/1996 | Vitter | 395/600 |

*Primary Examiner*—Thomas G. Black
*Assistant Examiner*—Jean R. Homere
*Attorney, Agent, or Firm*—Gifford, Krass, Groh, Sprinkle, Patmore, Anderson & Citkowski

[57] ABSTRACT

A method of data compression includes means to accelerate a direct query thereof. Input data are transformed into a multilevel n-ary tree structure wherein each leaf node corresponds to the creation of a memory storing unique occurrences of a particular data body, and each non-leaf node corresponds to a memory storing unique occurrences associated with its child nodes, whether leaf or non-leaf types. To accelerate a determination as to the solution of a query of the data, one or more pointers are further stored at each memory level, the pointers at least including those used to identify the parent of each child node and the children of each parent. In the preferred embodiment additional pointers are further stored in conjunction with each non-leaf node, these being used to identify other locations corresponding to unique occurrences derived through the same child nodes.

16 Claims, 4 Drawing Sheets

METHOD OF STORING COMPRESSED DATA FOR ACCELERATED INTERROGATION

REFERENCE TO PRIOR APPLICATIONS

This application is a continuation-in-part of U.S. patent application Ser. No. 08/207,382, filed Mar. 7, 1994, now abandoned, which is a continuation of Ser. No. 07/978,360, filed Nov. 18, 1992, now U.S. Pat. No. 5,293,164, which is a continuation of Ser. No. 07/706,949, filed May 29, 1991, now U.S. Pat. No. 5,245,337.

FIELD OF THE INVENTION

This invention relates to digital data conversion techniques which convert an input data body into an ordered data structure which is compressed relative to the input body for purposes of storage, transmission, encryption, interrogation, and so forth, and which may be augmented with signals representative of the relative frequency of occurrence of unique signals comprising the input data body for purposes of finding patterns or anomalies in, or preparing summary statistical information concerning, the input data body.

DESCRIPTION OF THE PRIOR ART

Methods and apparatus for data compression, or what is sometimes termed "text compression" operate upon bodies of incoming digital data such as alphanumeric text, digitized images, computer code or the like. These methods and apparatus reduce the memory requirements for storing the data and/or reduce the time required to transmit the body of data over a communication channel or to encrypt the data for security purposes.

Data compression operates by removing the redundancy in the input data body, and the degree of compression that may be achieved is proportional to this redundancy. Data compression systems may be broadly divided into loss-less systems in which the input data body can be exactly reconstructed from the compressed version or lossy systems often used for digitized analog signals such as speech and images in which a totally reversible reconstruction process is not required. The present invention falls into the class of loss-less systems, sometimes termed reversible or noiseless systems.

Loss-less compression systems may also be divided into statistical encoding, in which each symbol is assigned a code based on the probability that it will occur, and dictionary compression, in which groups of consecutive characters in the input data body are replaced by a code representing the storage location of that sequence in a dictionary. The present invention relates to compression of the dictionary type.

Dictionary methods of data compression may in turn be divided into static and dynamic dictionary arrangements. Static methods use a fixed dictionary based upon a priori knowledge of the general nature of the input data body. For example, if the data body is English text, the dictionary might be based on statistical occurrence of data sequences in that text. The alternative approach is a dynamic or adaptive dictionary encoder which utilizes the initial sections of an input data body to construct a dictionary which is modified as more of the data body is processed. The present invention relates to such a dynamic dictionary compression system.

Within the field of loss-less dynamic dictionary compression, an arrangement termed ZIV-LEMPEL compression has been regarded as highly efficient. Variations on the ZIV-LEMPEL method are disclosed in U.S. Pat. No. 4,464,650 to Eastman et al; U.S. Pat. No. 4,558,302 to Welch; and U.S. Pat. No. 4,906,991 to Fiala et al.

These ZIV-LEMPEL processors broadly accept the data body to be encoded as an input serial stream and create a dictionary which stores initial segments of the data stream. Subsequently occurring segments are compared to the stored segments to generate a code word which points to one end of the prior occurrence of the string in the memory, identifies the length of that string which is identical to the incoming segment, and includes the next unique character in the incoming segment. A broad overview of the field of data compression is contained in *Modeling for Text Compression*, Bell et al., ACM Computing Surveys, vol. 21, no. 4, December 1989.

Typically, data compression is not used to compress data comprised of tables of values; e.g., relational databases, B+ tree databases, and the like. Upon compressing the database, procedures such as ZIV-LEMPEL destroy the word boundaries that are used to predict where the table elements lie, making it impossible for database management software to perform search procedures. Hence, whenever data compression is used with data stored as tables of values, it is necessary first to decompress the data before attempting to perform an operation such as a search procedure. Additionally, because fast search times are critical in database operations, and because compression adds time to the process of searching a table, database software generally does not compress the data prior to storing it on disk. If any compression is performed it is done by a hardware element associated with the storage device, not the database management software. Thus, an improvement in the state-of-the art of data compression would be to establish a compression method or device that would enable databases to be searched while still compressed, thereby allowing more of the database to reside in main memory where the searches are carried out by the computer. This would have the effect of speeding queries of the database.

SUMMARY OF THE INVENTION

The present invention is directed toward the simultaneous compression of multiple streams of data into a dictionary or dictionaries, defined, for example, by the field structure of a database. However, the invention is not limited to such data structures, and a more general procedure is disclosed for directly searching the compressed body of data, and thereby accelerating the query thereof. Furthermore, the present invention is directed toward the compression of data having a plurality of field types, including means to accelerate a direct query. The method includes the formation of a hierarchically ordered dictionary of stored input data elements, or, literally, a sequentially ordered array of storage locations, called levels, wherein there is stored unique occurrences of elements comprising multiple parallel input data bodies, such that at every level are stored in a dictionary a record of the temporal and spatial associations occurring in the parallel input data bodies. The method may be likened to the formation of a multilevel binary tree structure having leaf nodes and non-leaf nodes. Each non-leaf node therefore defines a parent having two child nodes or children. Each leaf node corresponds to the creation of a memory used to store unique occurrences of a particular field data type, and each non-leaf node corresponds to a memory which stores unique occurrences associated with its two children, whether derived from leaf or non-leaf nodes. To further accelerate a query of the compressed multiple input data structure, and to permit mathematical operations to be accomplished immediately and directly, rather than depending on the complete solution of a query before mathematical operations are performed, or to determine the correlation among field data types, one or more pointers and counts of frequency of occurrence may be optionally stored at each memory level, the pointers at least including those used to identify the parent of each child node and the children of each parent. In one embodiment two "next pointers" are optionally stored in conjunction with each non-leaf node, these being used to identify other locations corresponding to unique occurrences derived through the same child nodes. Table 1 shows the storage structure of a non-leaf node element.

The preferred embodiment of the present invention comprises a node element, or memory, that, minimally, contains sufficient information to perform a faithful inversion. Because the amount of time required to form the above described data structure may be quite lengthy, a provision is made for hashing memories into storage locations. The parents to this application, now U.S. Pat. Nos. 5,293,164 and 5,245,337, which are incorporated herein in their entirety by reference describe an N-gram data storage system involving the formation of a memory at a level "td" as an n-tuple of pointers, where each tuple points to a memory at the level immediately therebelow, i.e., at level "td-1". This type of memory readily reconstructs the original data stream through all levels of the memory structure. Although the parents to this application explain the case of a single input data body, where the signals to be formed into memories appear sequentially in the data stream, the procedure for forming memories in this application takes simultaneously appearing signals from across multiple input data bodies, then hashes these into lists in the same manner as described in the parents to this application.

Further, in the preferred embodiment, a random sample of the input data bodies is formed and used to create only the lowest level memories, or leaves, of the data structure, with counts of occurrence maintained as described in the parents to this application. The lists thus created are subsequently ordered and indexed according to the decreasing relative frequency of the occurrence. This ordered set is then used in the formation of all subsequent memories with the observed effect of relatively more uniformly distributing memories into lists, such that every list contains approximately the same number of memories, which dramatically improves the comparison operation described herein.

As one illustration, given an imperative, find all contexts in which the j'th memory at level td (call it $m_{td,j}$, where j is simply an index) appears in the input data streams, $m_{td,j}$ must be mapped into every possible list containing it in any component of memories at the memory level above itself, i.e., td+1. Thus, for a td+1 memory consisting of, say, 5 components, the number of lists to be searched to find all the contexts of $m_{td,j}$ can be quite large. Accordingly, in the preferred embodiment, the number of searches is reduced by keeping a list of forward pointers in every memory tuple which point to the beginning of the level td+1 lists containing $m_{td,j}$ for every j. It may also be preferable to add the number of times a memory appears in a list to prevent searching every memory in a list before stopping. In the preferred embodiment, however, the next pointers are used to locate other memories in a list that contain the instant memory. Hence, a general memory has the form:

TABLE 1

| MEMORY DEFINITION $m_{td,j}$ | | | | | | | |
|---|---|---|---|---|---|---|---|
| mem_n | mem_n+1 | (list_n) | (list_n+1) | list_n+2) | (l_link_ptr) | (mem_cnt) | (next_lptr) |
| (mcnt_n) | (mcnt_n+1) | (lcnt_n) | (lcnt_n+1) | (lcnt_n+2) | (lc_link_ptr) | (no_mem) | (next_rptr) |

Where: mem_n and mem_n+1 are the n signals (n≧0) comprising $m_{td,j}$. The optional cells are indicated by parenthesis; mcnt_n are the counts for each of the memories mem_n; list_n are the level td+1 lists containing $m_{td,j}$ lcnt_n are the number of times $m_{td,j}$ appears in list_n; l_link_ptr is the link pointer to the rest of the list, and similarly, lc_link_ptr is the link pointer to the rest of the list counts; mem_cnt is the number of occurrences of $m_{td,j}$ in S; no_mems are the number of unique memories formed of $m_{td,j}$ at level td+1 (obviously, no_mems=sum(lcnt_n)); and finally, nxt_lptr and next_rptr and the pointers to the next occurrence of the memories mem_1 and mem_2, respectively, at the current level, td.

If, for instance, the data body to be compressed is a database, then it typically includes a plurality of data records, each with a plurality of data fields. In this case a method according to the invention comprises the steps of creating a dictionary for each field of the database to be compressed and stored, the dictionary consisting of a numerical index value associated with each unique field entry. A binary tree is then formed having terminal and non-terminal nodes, including a single, highest non-terminal node representative of all lower derivative nodes. The terminal nodes of the tree correspond to the dictionaries created for each field of the database to be compressed and stored, and each non-terminal node of the tree represents a table of associative memories consisting of numerical index values associated with each unique combination of the index values of the two nodes from which that non-terminal node is derived.

The method may further include, for certain classes of databases, notably static databases such as those used for decision support applications, the steps of canonically ordering one of the two sets of derivative index values within each associative memory table, and reducing the canonically ordered set of index values to binary form, alternating from one binary value to the other as a change occurs in the ordering. Data representative of the associative memory tables having been ordered and reduced, is then stored as a compressed version of the input records and fields, preferably along with at least certain of the pointers to accelerate direct interrogation, if desired.

In the preferred embodiment an initialization step is taken wherein a random sample of the parallel data bodies is formed and used to determine the order of the data bodies in which, and memory level at which, each distinct data body will be incorporated into the data structure. In particular, if for a given data body, the number of its constituent unique elements is large relative to the cardinality of the data body elements (e.g., the total number of elements comprising the data body, without regard to repetitions; that is, the ratio of the number of unique data body elements to the total number of elements comprising the data body is nearly unity), then that data body should be incorporated high in the data structure. All other such data bodies should be incorporated at the same or higher level in the structure, and ordered by decreasing number of unique elements from the left to the right. Table 2 illustrates this principle.

For instance, suppose two of the data bodies, or data streams, consist of digitized images of objects taken at random from two distinct sources of images, such that every image is unique, and the simultaneous appearance of any two images is always coincidental and unrelated (i.e., the event, image A from stream 1 occurs simultaneously with image B from stream 2 is purely a random event). Suppose further that the images in each stream are represented by the output from the compression procedure in the parents to this application. Then these streams cannot be further compressed by associating them one with another in the manner of the data structure herein described, and the most efficient representation of the simultaneous occurrence of one image with another is to construct a single set of pointers at the highest level of the data structure, thereby creating what is, in effect, a cross reference index of objects from the two data streams.

TABLE 2

| Original Ordering of Five Parallel Streams of Data Bodies Containing 25,000 Total Elements | | | | |
| --- | --- | --- | --- | --- |
| data_body #1 | data_body #2 | data_body #3 | data_body #4 | data_body #5 |
| 2 unique elements | 100 unique elements | 60 unique elements | 20,000 unique elements | 8,000 unique elements |
| Final Ordering of the Five Parallel Streams of Data Bodies Containing 25,000 Total Elements | | | | |
| data_body #4 | data_body #5 | data_body #2 | data_body #3 | data_body #1 |
| 20,000 unique elements | 8,000 unique elements | 100 unique elements | 60 unique elements | 2 unique elements |

In another embodiment, one in which the step of canonically ordering one of the two sets of derivative index values within each associative memory table, includes canonically ordering the set representative of the larger of the two memory tables which that non-terminal node is derived. In forming the binary tree, fields with large dictionaries are preferably located high in the tree, with the tree being further arranged such that one of the two derivative memory tables for a particular non-terminal node is much larger than the other.

In a preferred hardware configuration, all data except that associated with the single, highest non-terminal node is stored in a type of memory have a faster access time as compared to the type of memory used to store the data associated with the single, highest non-terminal node. For example, data associated with the single, highest non-terminal node may be stored on disk, whereas all other data is preferably stored in a fast-access semiconductor read/write memory such as a random-access memory or RAM.

DETAILED DESCRIPTION OF THE PREFERRED EMBODIMENT

Figure 1:
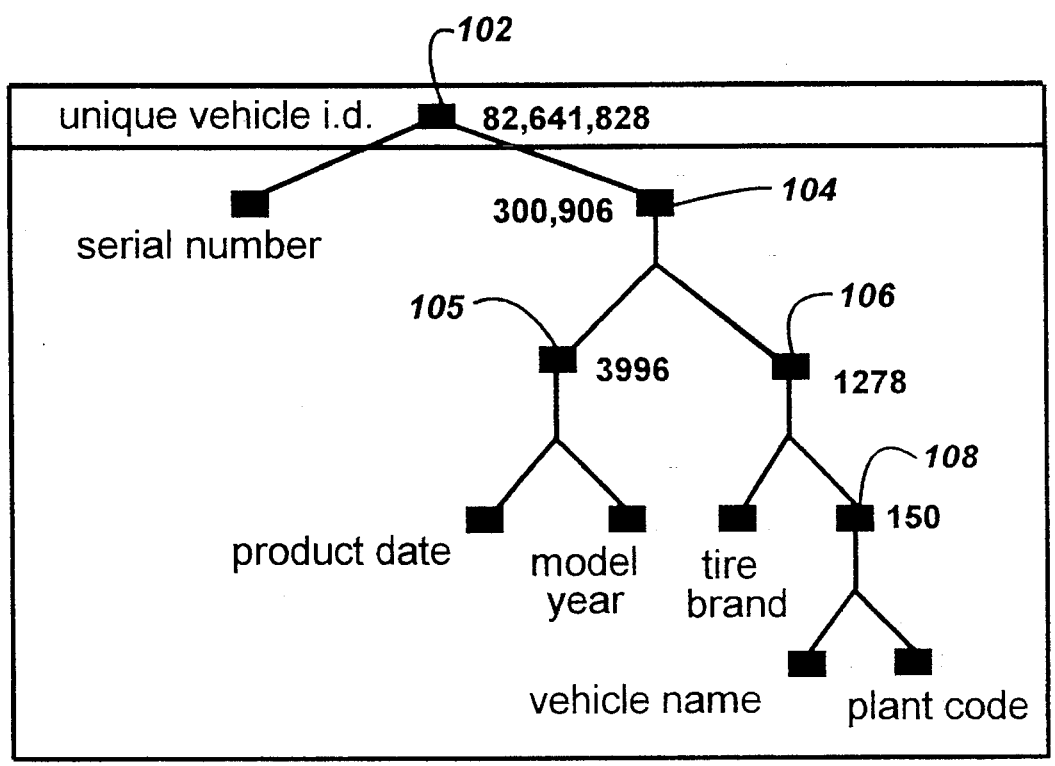
FIG. 1 is a drawing of binary tree data structure formed using a preferred pairing strategy according to the invention.

The parents to this application, now U.S. Pat. Nos. 5,293,164 and 5,245,337, disclose methods and apparatus for implementing a loss-less dynamic dictionary compression scheme having improved compression efficiency, speed and simplicity relative to prior art techniques, at least with respect to certain classes of data. Broadly, the concept is used to store information in terms of associations, an association being the memory of the occurrence of a set of events. A subsequent occurrence of an identical set of events does not cause a new memory, but instead reinforces the association already in memory. Once the machine has learned certain sets of events, they are available for comparison with sets occurring later in the input data stream, and when an association is recognized it is unnecessary to learn the new section but it is sufficient to merely identify the new section as being equal to the previously learned section. This associative factor results in the stored data structure involving less memory than would be required to store the full input data stream.

The structure of a basic implementation is a hierarchy of processes hereafter referred to as levels. Each level implements a function which will generate a single output value for every set of input values. The function must be reversible, that is, for every output value it must be able to operate in reverse, so as to reproduce a single and unique set of input values. It is not necessary that every level of the machine use the same function, provided each function is logically reversible.

One such function would be to consider the input values as fixed-length binary numbers, and to merely concatenate a pair of numbers to produce a fixed-length binary number with twice the length (twice as many bits). The reverse of this function is to split the long binary number into two shorter numbers. This is the simplest function that meets the requirements, but it is not a very useful since the number of bits in a number would double at every level.

Another class of functions that can be used are ones that make use of local storage within the level to record some information about the input values which have actually been processed by that level. A simple function of this type is one which keeps in its local storage a copy of every unique pair of input values which has been presented to it. The address of the local memory which contains a copy of the input pair is used as the output value. When an input pair is encountered that is the same as a pair that was previously processed, no new local storage is used, and the address of the local memory that already contains values matching the input values is used again as the output value. This function, with a few improvements to optimize the speed of comparing the new input to the associations already learned, is the basis for a preferred embodiment of the invention disclosed in the parents to this application.

Broadly, the method involves analyzing an incoming data stream in serial fashion, parsing the stream into short sequences of data elements, preferably pairs, and generating an output stream consisting of signals representative of each of the successive sequences of the input data. This output stream is provided to a second process or level which operates on the output signal of the first process in the same manner that the first process operated on the incoming data stream. The output of the second level is provided to a third level, and this is repeated through a finite number of levels.

The output signal from each level contains fewer data elements than the incoming signal so that successively higher levels operate at lower rates since each level must await processing of a plurality of input data elements by the proceeding level before it receives a single data element from the next lower level. The preferred method, then, may be viewed as the repetitive application of the algorithm of detecting the previously non-occurring sequences of data in an input data stream, storing such previously non-occurring sequences and generating an output signal representative of the position of storage of each incoming sequence in the storage means with the output signal having fewer data elements than the incoming sequence.

The incoming data stream may readily be reconstructed from this memory structure by reversing the process and feeding down stored data elements from higher levels to lower levels to cause the regeneration of the input data stream in the same way that it was dissected in the learning process. In the case where each pair of B inputs to a particular level result in a single output during the data storage process, the occurrence of a unique pair at the input will cause a four-word entry to be stored in memory. Two of the words constitute the unique pair, the third word is a count of how many times that pair has occurred in the input data and the fourth word is a link pointer representing the address of another entry in that memory which has occurred less frequently in the input.

Each level also preferably performs a hashing function to assign each pair of numbers from the input to one of a plurality of linked lists. In one embodiment the hashing function operates to divide all input pairs into one of the lists by generating the sum of a predetermined number of least significant bits of the two numbers in each input pair and assigning all pairs with the same sum to the same list. The processor also constructs a hashing index table containing a pointer to the most frequently occurred entry in each of the linked. This arrangement is used to economize the task of determining whether an input pair has previously occurred. After summing the least significant bits of that input pair to determine which of the linked lists it should be compared to, the hashing table is then used to determine the memory location of the pair of that linked list which has occurred most frequently and comparison is made between the input pair and each of the sequentially less frequent stored input pairs in that linked list to determine the uniqueness of the input pair.

An alternative embodiment provides a way to continue to process new input records even after all of the available memory in a level has been filled up. After an initial learning period during which all unique data pairs in the input to a level result in entries in the data structure, a second mode of operation is begun. In this second mode, when a unique pair is detected, a null signal is outputted to the next highest process, and the unique data pair is added as an appendage to the output signal from that processor and is passed upwardly to the highest level in the system. The appendages from all lower levels are stored with the output from the highest level. When a record is reconstructed, the appendages are passed back down so that any nulls in a reconstructed record can be replaced by the appropriate unique data pair. This arrangement allows the system to process an unlimited number of input records and to reversibly reconstruct the records.

Another alternative embodiment reserves part of the memory in a level for data pairs which do not occur during the first mode of operation, but which occur at a relatively high frequency once they have begun to occur during the second mode of operation. This is accomplished by dividing the memory associated with each level into two sections, one termed permanent and the other termed temporary. During the first mode of operation, each input which has not previously occurred in the input stream is stored in the permanent memory section. After an initial learning period during which all entries in the data structure are made in the permanent section, a second mode of operation is begun. In this second mode, when a unique pair is detected, it is loaded into the temporary memory section, a null signal is outputted to the next higher level, and the unique data pair is added as an appendage to the output signal from that level and is passed upwardly to the highest level in the system. The appendages from all levels are stored with the output from the highest level. When a record is reconstructed, the appendages are passed back down so that any nulls in a reconstructed record can be replaced by the appropriate unique pair. When an entry in the temporary section has occurred a predetermined number of times in the input signal it is promoted to permanent memory and treated in the normal manner. This arrangement allows the system to process input records of unlimited length and to reversibly reconstruct the records.

EXTENSIONS RELEVANT TO SOL

These basic techniques may be extended to provide alternative embodiments wherein data may be compressed and, by storing pointers in a particular and inventive manner which will be described subsequently in detail, the data may be interrogated directly in compressed form. To illustrate this aspect of the invention, a database of automotive-related records will be used, each record including fields pertaining to a particular vehicle, such as the name of the vehicle, model year, product date, the manufacturing plant, and serial number. Although this example is directed toward this particular application, use of this aspect of the invention is by no means limited to this type of data or the way in which this particular database is structured. Indeed, broadly speaking, this embodiment of the invention may be used as a general accelerator to what is known in the art as an SQL or structured query language, which outlines protocols used for database interrogation. Furthermore, this embodiment makes possible certain queries that cannot be constructed with SQL and further provides an effective procedure for searching unstructured data types that have been stored consistently with respect to the methods disclosed herein and in the parents to this application. Indeed, where the word "field" is mentioned in the following text, the words "data stream" may be substituted without creating inconsistency.

In SQL one cannot write a procedure to determine if any particular record contains entries that are uncorrelated with respect to each other, whereas most other such records in the database are correlated. Using memory counts and the tree structure described herein, one can establish simply and quickly that the occurrence of a set of field values is or is not unusual with respect to others in the database. This is done by calculating the joint probability using the relative frequencies of the constituent memories from the level below (i.e., the marginal probabilities), and assuming that the particular set of field values being tested are independently distributed. This result is compared to the statistic of their relative rate of occurrence in the actual database. If the two numbers are the same, then the field values are independently distributed, and the fact of their simultaneous appearance is purely a random event. If the two calculations produce numbers that are greatly different from one another, then it can be said that the simultaneous occurrence of the field values is not subject to chance, but rather depends on a cause that may or may not be known.

Notwithstanding that accelerated query methods are discussed herein relative to databases, the methods described may be applied to data types generally understood in the art to be "unstructured." Images, text, and signal data from sensors stored in digital form are among these unstructured types. If a data stream is comprised of images, for instance, and it is stored using the methods described in the parent to this application, then a pattern within an image can be found by establishing for a given pattern prototype the number of matching patterns found at every level, and writing a probability criterion for selecting those images containing the most number of matches over all levels to the pattern prototype. Hence, this invention further provides a utility for searching structured and unstructured data objects given these are stored using the methods described herein and in the parents to this application.

Reference is made to FIG. 1, which illustrates one particular structure or tree for the vehicle-related data. Again, not only are the categories set forth in the figure by no means fixed, the way in which the categories have been paired is also subject to certain considerations which are set forth in detail below. Broadly, as a result of a field pairing strategy unique to this invention, the binary tree of FIG. 1 results for this particular example, the terminal nodes or leaves of this tree (i.e., plant code, model year, serial number, etc.) being representative of the database record fields.

Broadly, a dictionary is created for each field wherein each field value is associated with a numerical index value and stored in the dictionary. Each non-leaf or non-terminal node in the tree (such as 105, 108, etc.), however, leads to the creation of a table of associative memories whose two components are indexes to the memory tables of the nodes corresponding to the derivative branches or "children," whether terminal or non-terminal nodes. For example, a dictionary is created for each field represented by the terminal or leaf nodes such as serial number, model year, plant codes and so forth, whereas each non-terminal node leads to the creation of a table of associative memories whose components are indexes to the memory tables of the node's two children. Thus, at node 108 for example, an associative memory table will be based upon the two dictionaries created with regard to the terminal nodes representative of the fields "vehicle name" and "plant code," whereas, at node 106, the associative memory table components will comprise the dictionary created with respect to "tire brand" and the associative memory table previously created which corresponds to node 108. This process is continued until a final associative memory table is created with regard to each unique vehicle ID code at node 102.

Thus, this embodiment of the invention extends the general principles described earlier, in that at the commencement of the compression process, actual or raw data is used to create memories whereas, at higher levels, previously created numerically indexed data is itself nested within other associative memory tables. However, the alternatives which will now be described differ in several respects, including the fact that the "input" of the data leading to the creation of the various dictionaries and memory tables occur at multiple points, these being the non-terminal or leaf nodes, as opposed a single input data stream in the general sense. Additionally, as mentioned earlier, the strategy used to arrange the tree so as to provide the greatest level of compression is unique to the instant invention, as is the ability to interrogate or query the data directly in its compressed form, and as is the use of pointers to further accelerate the interrogation of a database in its compressed form.

In describing the embodiment of the instant invention, memories from the input data are created in an associative memory table corresponding to each non-terminal node in the tree which is ordered by indexes relating to one of the two derivative branches of that node. Reference will be made here to the "left" child with the understanding that each right child may alternatively be used so long as the process described below is applied consistently. This indexing can take place at any time in accordance with the development of the associative memory tables according to the invention, including before or during the creation of a particular table. That is, the ordering of left child may take place during the creation of the table itself, thus forgoing the need to create the table with the left indexes in non-ordered form, as alluded to previously.

Figure 2:
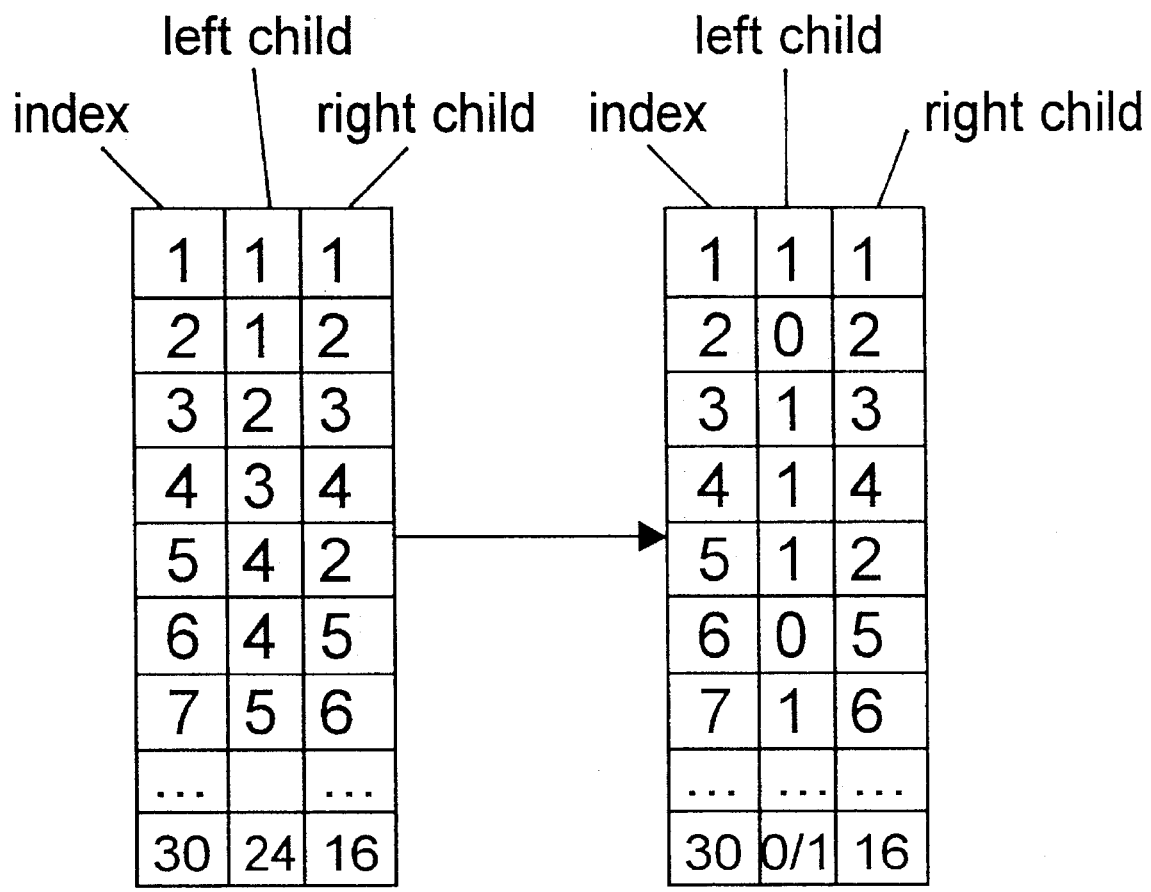
FIG. 2 shows two tables used to illustrate how ordered indexes are reduced to differences to enhance data compression.

Once ordered, the left child indexes are reduced to differences. Since each node's memories are arranged in order, all left child indexes can be reduced to a difference whose value is positive. That is, for each memory at a particular node, there exists some memory at the parent of that node which contains an index to that memory. Therefore, there are no gaps in the ordered indexes, and the left child indexes can be reduced to a difference whose value is either zero or one. This process is shown in FIG. 2 in the left table, which has left child entries in canonically ordered form. These canonically ordered values are then reduced to differences in the right-hand table. Beginning with a logical one, it is noted that at index level 2, the ordering changes from a 1 to a 2. Thus, the logical value is changed at this level from a 1 to a 0. The ordering continues in a consistent fashion until level 6, at which time a second "4" is found in the ordering, so, at level 6 the logical sign in the table on the right changes from a 1 to a 0. As mentioned, since it is known that there are no gaps in the left-child indexes as ordered, this process of replacing the increasing left-child indexes with ones and zeros depending on the change in the ordering, is valid, and may continue until completed for that table.

The reduction to differences may lead to a profound impact on storage requirements in certain cases. For example, in the example of FIG. 2, as each left child has been reduced to either a logical 1 or 0, only one storage location is required for each left child index as opposed to a requirement equal to $\log_2$ of the index range. For the right child, (since it cannot also be subject to this reduction through differences) if R is in the range of indexes, each right child uses $\log_2$ R bits for storage requirements. For example, referencing FIGS. 1 and 2, and assuming that there are 24 entries in the "vehicle name" table and 16 entries in the "plant code" table, resulting in a non-terminal node having a total of 30 entries representative of the unique combinations between the two child nodes, the size of the parent node is equal to 30×(1+$\log_2$ 16) or 115 bits, where 30 represents the number of entries in the table, 1 represents the cost of each left-child reference, and $\log_2$ 16 represents the cost of each right-child reference since there are 16 entries in the "plant code" reference, this being the right child.

Therefore, one aspect of the pairing strategy which is unique to this invention prefers that to take full advantage of the fact that left-child indexes are of a fixed length and practically "free" in terms of storage, the left child with the larger table should reside on the left branch of each non-terminal node. As a demonstration of this rule, assume that instead of plant code being on the right and vehicle name on the left, the positions are reversed (or not reversed but the reduction to differentials is given a right-child preference). In this case, the size of the parent will be 30×(1+$\log_2$ 24) which is equal to 180 bits, instead of 115.

Other pairing strategies consistent with this invention are as follows. First, fields that correlate should be placed close together in the tree. Indeed, fields which correlate to a great degree should preferably be paired directly. Second, since large dictionaries result in large parent nodes, these should be placed as high as possible in the tree. Thirdly, in many cases it is preferable that children have tables of unequal sides. This may seem to be inconsistent with the desire that fields which correlate be placed as close together as possible in tree, and to a certain degree a tradeoff is involved. However, even though fields which correlate should be placed closed together, a degree of unbalance is also desirable, since if one child is larger, this will be the one preferably reduced to differences so as to minimize storage requirements.

Another aspect associated with reducing memory requirements involves comparing the number of unique values found in a particular record to the number of bits used to define the field for that entry. For example, if a field of two bytes is allocated to store a particular record, but only three unique record values are found, in actuality, only two bits are needed as an index to a table created in accordance with the invention, and yet these two bits will nevertheless provide sufficient capacity, resulting in a compression ratio, in this case, of a 8:1. Of course, the greater number of unique values found in relationship to the number of bits allocated to the field size, the lower the actual compression ratio will be.

CONVERGENT VERSUS LINEAR NEUREX

Convergent neurex is the name given to those nodes where the number of memories at the node has stabilized in relation to new entries, whereas linear neurex refers to those nodes where the number of memories continues to increase linearly with respect to increasing numbers of input values. For example, if each vehicle in the instant example is associated with a unique identification number, with each new vehicle ID input, the storage requirements will not immediately converge, but will continue to require unique values. With a convergent neurex, on the other hand, storage requirements will grow as input is received, but will taper off and eventually reach a convergent value, as the number of unique inputs slowly decreases depending upon the finite nature of the database.

Generally speaking, more abrupt convergence will occur at the lower levels in the tree and the higher up the tree one progresses, the more gradual will be the rate of convergence. For example, assuming that in the example of automotive data, based upon the number of unique values found, a composite field of 16 bits is required, with one bit being needed to index each new serial number, resulting in a total of 17 bits for each new entry into the final associative memory table. Given a field size of 21 bytes or 168 bits which would otherwise be required to store the record without this value analysis, by limiting storage to the number of bits required to index all unique values, a compression ratio of approximately 9.882:1 results, assuming other nodes have converged.

Another distinction between convergent and linear neurex concerns the fact that the convergent neurex typically store correlated data, and this data is generally of the type including information to be searched and/or retrieved. Linear neurex, on the other hand, usually store only unique tags, this data is likely to be retrieved only occasionally or, perhaps, very rarely. Thus, another aspect of this invention is to ensure that at least the convergent neurex is stored in a type of memory exhibiting a faster access time as compared to the storage medium used for the linear neurex. In the preferred embodiment, some or all of the convergent neurex stored in random-access read/write memory, implemented, for example, with semiconductor dynamic RAMs or DRAMs, whereas the linear neurex nodes may be stored using disk drives.

The determination of which nodes are to be kept resident in main memory and which are to be left on the disk drives is a complex problem to be solved given knowledge of the computing environment; e.g., processor speed, amount and speed of available main memory, amount and speed of attached disk drives, and the like. A thorough understanding of the behavior of the nodes in the data structure, however, may help to reduce the number of options to consider. For instance, a convergent neurex can be divided into substructures that are paged to and from disk to save main memory requirements. However, it is almost a tautology that the less data there is to search the faster the search will execute. Hence, the ability to search compressed data directly, rather than uncompressed data of much larger volume presents the obvious benefits.

QUERY ALGORITHM

Figure 3:
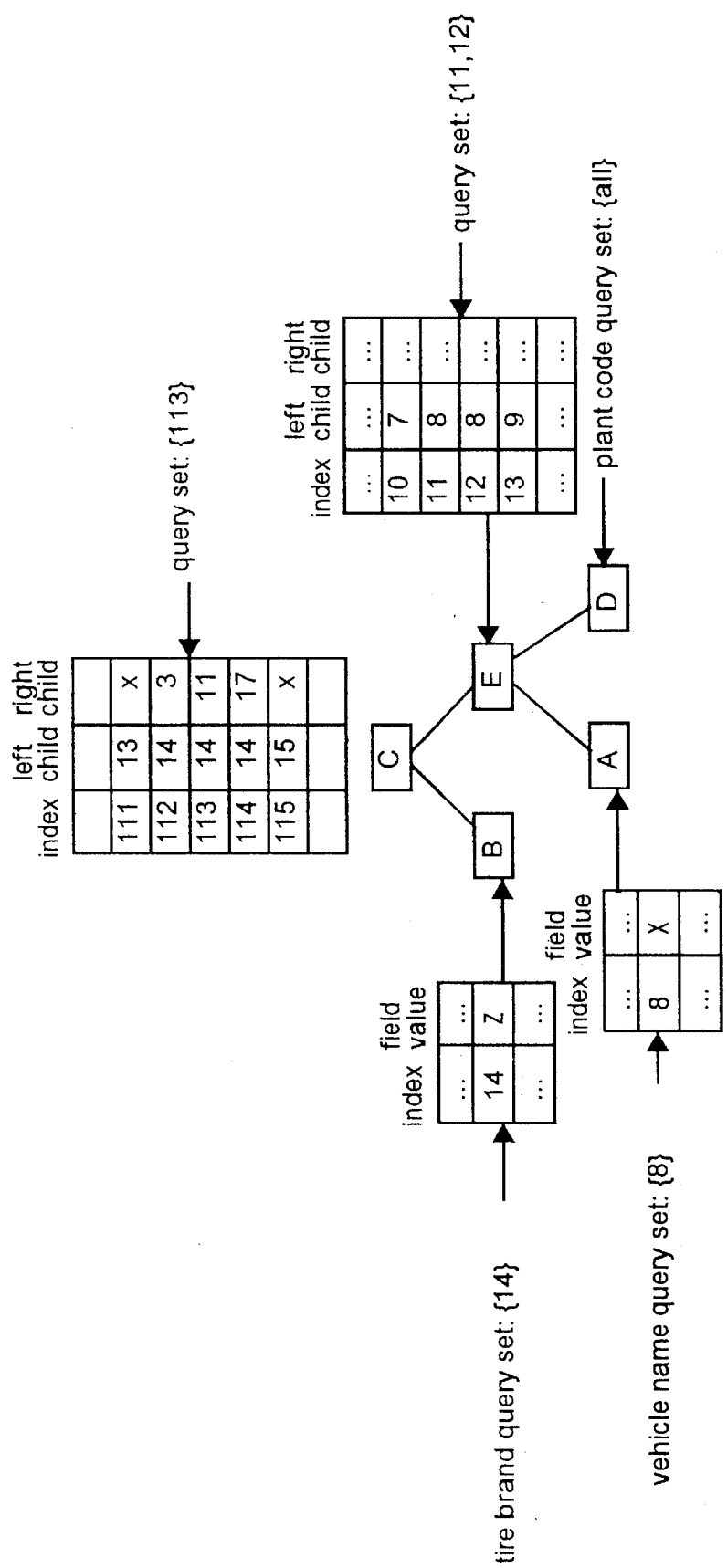
FIG. 3 is a diagram used to show how a particular query request propagates through a binary tree structure according to the invention, but without the advantage of stored pointers to facilitate direct interrogation.

In order to directly interrogate the compressed structure just introduced, a query algorithm is used to according to an alternative aspect of this invention. Starting at the leaf nodes, and propagating up the tree, a list of memories which satisfy a particular query is collected at each node. A leaf node memory satisfies the query if its value is not excluded by the query and an associative memory satisfies the query if both of its component indexes refer to memories that satisfy the query. Referring to FIG. 3, as an example assume that one wishes to find all model X cars having Z brand tires. Starting at node A, field value XXX which represent model X cars, has an index value of 8, and ZZZ, at node B, is associated with an index value of 14. Now, at each node, the set of memories which satisfy the query is created whereas model X cars and Z brand tires have only one set which satisfies the query. Since all plant codes may be involved, for node B, the entire set is used. At node E, however, it is desired to know which of the plant codes have 8 for its left child, which would represent model X cars, but can have anything for the right child. Similarly, at node C, we wish to know of any indexes which contain 14 as the left child. Indexes 11 and 12 are relevant at node E, since the left child is 8 and the right child is irrelevant, and at node C, then, we are looking for any entry having a left child of 14 and a right child of 11 or 12. The only index which satisfies all of the above is the query set {113}.

As part of the query algorithm of this invention, an approach is used whereby all memories need not be searched in order to satisfy a particular request. In an embodiment each memory further includes five elements which function as pointers. Two of these elements are used to point toward the memories used to create that particular associative memory table, with the first pointer being directed toward its left child and the second being directed toward its right child. A third pointer points toward the first memory of the next level where it is contained, this being called a forward pointer. Finally, the last two of the five elements are "next" pointers, the first being used to point to the next memory within the same level which contains the same first child, whereas the second next pointer points to the next memory of the same level that contains the same second child. In practice, as the "next" pointers are not required for direct querying of the database, if the purpose of a particular application is strict compression for archival data without interrogation, these next pointers need not be stored, thus further reducing memory requirements.

Figure 4:
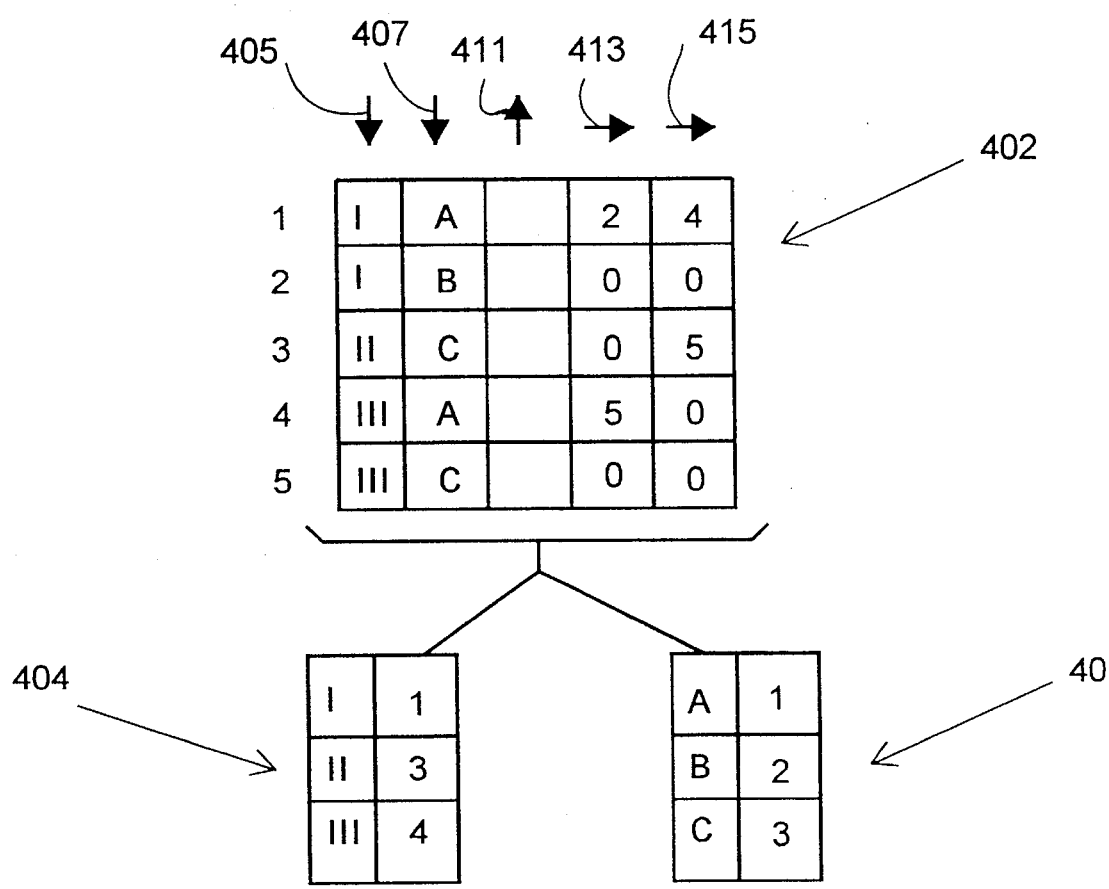
FIG. 4 is a diagram which shows a non-terminal node and two children, along with salient pointers responsible for more accelerated query.

Referring now to FIG. 4, assume that a node 402 contains five memories, labeled 1 through 5, resulting from the compression of the two nodes 404 and 408 on the and right, respectively, as shown. The left and right pointers, 405 and 407, respectively, are shown in the columns contained in the "down" arrows in memory 402. The forward pointer 411 is contained in the central column, with no entries since the node above 402 is not being discussed in this example. The next pointers are shown by arrows 413 and 415, in the rightmost to columns of the memory 402. The first row of the memory 402 contains a unique combination of I-A so the pointers and 405 and 407 indicate that this row has been derived from these values. The next pointer 413 in row 1 contains a number 2 since row 2 contains another entry with a I. Similarly, the next pointer 415 in row 1, which corresponds to the right child, contains a number 4 since it is not until the fourth row that another A is found. In row 2 of the memory 402, both next pointers are 0 since this is the last occurrence of I and the first and last of B. In row 3 it is the first and last occurrence of II, so the next pointer 413 is a 0, but there is another entry with C in row 5, so the next pointer 415 contains a 5.

In row 4 of the memory 402, III is found but the next pointers 413 contains a 5 since another III is found in the row below. The next pointers 415 is a 0 since this was the second and final entry containing an A, and the fifth row contains 00 since this is the last occurrence of III and C. It should be noted that in the child table 404 and 408, which are incomplete for this example, the numbers in the right columns of each correspond to their forward pointers into the memory 402. Thus, I, II and III, respectively, are found at levels 1, 3 and 4 in the node above, and A, B and C, respectively, are found in rows 1, 2 and 3 in the memory 402.

Suppose it is desired to search an image I for a particular string s (here being two-dimensional). If s ∈ s is a pixel, and the number of bits in s, i.e., #(s)>1, then s may contain noise in the low order bits. Hence, s may reasonably be viewed as a range of intensities, $R=\{s_{low},s_{high}\}$, where $s_{high} \geq s \geq s_{low}$, rather than a specific intensity s. The search string s' is formed by replacing every s with the $s_{high}$ values, and s' has N components (N is still the number of signals per memory). Thus, rather than find $s'=L^{-1}(m_1)$, we find $s' \leq L^{-1}(m_1)$, where L is the function that creates a memory. A user would determine the resolution that determines $s_{high}$, and in general, ambiguities arising from quantization errors would be resolved by choosing both objects for the search string. Otherwise, the above procedure will apply to the balance of the search.

The above may be generalized as follows: Let $R^* \subset R$ be a range of (real number) values. Let B be a Borel set that covers $R^*$. A signal s, with noise, is any $s \in B_i$, for some i. The noise character of the signal must be defined empirically, but, if a memory structure M contains noisy signals, then a search necessarily involves inequalities at the lowest level. To reduce scattering memories throughout M, the non-noise bits of the input signal are hashed rather than the lowest order (noise) bits of the signal.

The above may be applied to numeric data in databases. This may be done by treating any field in a relation that has type "number", including, of course, dates and times, as a Borel field of values. A proper hash using these fields normally requires running a level 0 test of signal frequencies so as to equally distribute the signals to lists. (This might also match a good distribution of queries by signal frequency.) Thus, if query on a date field requires any date in some range, and the range equals the hash list contents, then the hash list containing the signals in that range are easily found and any memory formed by a member of that has list should be hashed into lists that minimize neighborhood boundaries.

Finally, a database is a memory structure where every field can be thought of as the top level of a memory structure. Now, because relational databases are comprised of relations defined by fixed length fields, then there is no problem with phase angle variations in the input data stream. The beginning signal in every field is well defined. However, it is possible that certain database managers allow entries to be keyed improperly, i.e., nulls or fills which offset the first signal from its normal position within the field. A switch that allows a user to select phase angle variations within a field would therefore be allowed. It is also possible for a field to be a trinary number. The frequency of the field elements may be (0,1,null) and the memory count, mem_count, might well be mem_count=No_Records/3 for any of the three elements. If No_Records is large, then the search might needlessly produce search strings, when a simple structural change could be implemented that implies where in the memory structure all the memory containing one of the trinary elements lay at all levels above level 0. As such, placement of extremely high frequency, low level 0 memory structure table contents counts can save considerable processing time for queries using these such field values.

As a final example regarding database query applications, suppose it is desired to find all the names, including misspellings, that match a target name string. This can most easily be managed if the names are input to a name memory structure prior to being put into the level 0 field of the database memory structure. In this way, the context, size $L_{max}$, will be the largest name pattern, i.e., the names field width. The name pattern with suitable fill operators can be input to the query processing facility and all variations extent in the database will be found. Similarly, all the duplicate records containing all the name variations can be found, and perhaps pruned form the database.

Having thus described the invention, I claim:

1. A method of storing, in compressed form, a plurality of simultaneously occurring parallel data bodies, each comprised of sequentially ordered signals and with implied associations among the signals in the parallel data bodies, comprising the steps of:

creating a dictionary of unique signals for each of the simultaneously occurring parallel data bodies to be compressed and stored, the dictionary in each case consisting of a numerical index value associated with each unique field entry;

forming an n-ary tree having terminal and non-terminal nodes, including a single, highest non-terminal node representative of all lower derivative nodes, the terminal nodes of the tree corresponding to the dictionaries created for each of the simultaneously occurring parallel data bodies to be compressed and stored, each non-terminal node of the tree being represented by an associative memory assigning a numerical index value to each unique combination of the index values of the two nodes from which that non-terminal node is derived;

ordering the elements of the n-ary nodes by frequency and, thence, canonically within each associative memory;

canonically ordering one or more of the "n" sets of derivative index values within each associative memory;

storing a signal indicative of the counts of the number of times a signal or group of signals occurred in the data body;

reducing the canonically ordered set of index values to binary form, alternating from one binary value to the other as a change occurs in the ordering; and storing data representative of the associative memories having been ordered and reduced.

2. The method of claim 1, the simultaneously occurring parallel data bodies being representative of a database characterized in having tables of records comprised of elements called fields.

3. The method of claim 1, further including the step of pre-compressing one or more of the simultaneously occurring parallel data bodies using an N-gram data storage system.

4. The method of claim 1, further including the step of taking a random sample of the simultaneously occurring parallel data bodies to be compressed in order to determine an ordering and composition of the nodes in the n-ary tree.

5. The method of claim 1, further including the step of hashing the input signals into linked lists comprising the nodes of the n-ary tree.

6. The method of claim 1, further including the step of creating indices indicative of the locations where there are stored signals relating to the current storage at the node immediately above a given node.

7. The method of claim 1, further including the step of creating indices indicative of the locations where there are stored signals relating to the current storage at the node immediately below a given node.

8. The method of claim 1, further including the step of creating indices indicative of another location in a given node storing the same signals from a derivative node.

9. The method of claim 1, wherein additional counts are kept which relate to the number of occurrences of each of the signals described at a given node.

10. The method of claim 1, where the elements of the nodes are searched for matches to a previously identified signal set and a signal indicative of at least the relative success of the match through a specified number of levels.

11. The method of claim 1, wherein the step of canonically ordering one of the two sets of derivative index values within each associative memory includes canonically ordering the set representative of the larger of the two memories from which that non-terminal node is derived.

12. The method of claim 1, wherein the step of forming an n-ary tree having terminal and non-terminal nodes includes the step of combining signals which exhibit a high degree of correlation therebetween.

13. The method of claim 1, wherein the step of forming an n-ary tree includes the step of locating fields with large dictionaries high in the tree.

14. The method of claim 1, wherein the step of forming an n-ary tree includes the step of arranging the tree such one of the two derivative memories for a particular non-terminal node is much larger that the other.

15. The method of claim 1, wherein the step of canonically ordering one or more of the sets of derivative index values within each associative memory includes canonically ordering the set representative of the largest of the derivative memories.

16. The method of claim 1, wherein the step of storing data representative of the associative memories having been ordered and reduced includes the step of storing all data except that associated with the highest non-terminal node or nodes in a type of memory have a faster access time as compared to the type of memory used to store the data associated with the highest non-terminal node or nodes.

* * * * *